United States Patent [19]

Kennon et al.

[11] Patent Number: 4,707,679

[45] Date of Patent: Nov. 17, 1987

[54] MAGNETIC TAMPER DETECTOR

[75] Inventors: Jerry M. Kennon; Leland E. Hayden, both of Raleigh, N.C.

[73] Assignee: Westinghouse Electric Corp., Pittsburgh, Pa.

[21] Appl. No.: 11,364

[22] Filed: Feb. 2, 1987

Related U.S. Application Data

[63] Continuation of Ser. No. 663,254, Oct. 22, 1984, abandoned.

[51] Int. Cl.⁴ ..................... H04M 11/04; G08B 23/00
[52] U.S. Cl. ............................ 340/310 A; 340/310 R; 340/870.02; 307/39
[58] Field of Search .......... 340/310 A, 310 R, 825.22, 340/825.04, 870.02; 307/38; 379/107; 324/419

[56] References Cited

U.S. PATENT DOCUMENTS

| | | | |
|---|---|---|---|
| 3,683,276 | 8/1972 | Ramsey . | |
| 3,810,683 | 5/1974 | Zisa et al. . | |
| 3,842,249 | 10/1974 | Geyer et al. | 340/825.22 |
| 3,899,774 | 8/1975 | Binnie et al. | 340/825.04 |
| 3,942,170 | 3/1976 | Whyte . | |
| 3,943,498 | 3/1976 | McClelland et al. . | |
| 3,967,264 | 6/1976 | Whyte et al. . | |
| 4,008,458 | 2/1977 | Wensley | 340/870.02 |
| 4,034,292 | 7/1977 | McClelland . | |
| 4,296,411 | 10/1981 | Romanelli et al. | 340/870.02 |
| 4,298,839 | 11/1981 | Johnston | 340/870.02 |
| 4,300,125 | 11/1981 | Loshing et al. | 340/310 A |
| 4,302,750 | 11/1981 | Wadhwani et al. | 340/870.02 |
| 4,311,964 | 1/1982 | Boykin . | |
| 4,316,262 | 2/1982 | Mizuta et al. | 340/310 A |
| 4,323,882 | 4/1982 | Gajjar . | |
| 4,342,908 | 8/1982 | Henningsen et al. . | |
| 4,379,284 | 4/1983 | Boykin . | |
| 4,382,248 | 5/1983 | Pai . | |
| 4,424,485 | 1/1984 | Zisa . | |
| 4,462,026 | 7/1984 | Munday . | |
| 4,467,314 | 8/1984 | Weikel et al. . | |
| 4,491,791 | 1/1985 | Balch et al. | 340/870.02 |

Primary Examiner—Robert L. Griffin
Assistant Examiner—Curtis Kuntz
Attorney, Agent, or Firm—G. E. Hawranko

[57] ABSTRACT

An electric meter is provided with a magnetically sensitive switch and a means for detecting the activation of the switch. A program is provided for sensing, recording and transmitting the status history of the magnetically sensitive switch to a remote device. The electric meter is connected in signal communication with a power line communication system and provided with the capability of transmitting and receiving messages in conjunction therewith. The electric meter senses the presence of a strong magnetic field in the region of the electric meter and, if other appropriate flags are not set, this information is used to determine that an effort to tamper with the meter by using magnetic fields has occurred.

8 Claims, 3 Drawing Figures

MAGNETIC TAMPER DETECTOR

This application is a continuation of application Ser. No. 06/663,254, filed Oct. 22, 1984, now abandoned.

BACKGROUND AND SUMMARY OF THE INVENTION

The present invention relates generally to electric meters and, more particularly, to an electric meter that has the capability of detecting an attempt to tamper with the meter through the surreptitious use of a magnetic field.

Electric utilities have been using electric meters for many years to measure the magnitude of electrical energy consumption of its customers. In more recent years, electric utilities have begun to utilize electric meters that have the capability of communicating with a central communication station. One particular means for providing this communication capability is to utilize the power line system of the electric utility. A central transmitting and receiving station is generally provided that has the capability of sending messages to a multiplicity of remote meters that are located at consumers' residences and receiving messages transmitted therefrom.

Whether conventional electric meters or meters with transceivers are used, electric utilities face the potential problem caused by tampering with the meters. Tampering represents a significant and costly problem for electric utilities whether the tampering is caused by a consumer attemping to benefit economically from damage Many types of tampering procedures are known to those skilled in the art of electrical metering. One particular method of tampering that is difficult for an electric utility to detect is the use of a strong magnetic field to effect the magnetism of the permanent magnets used in conjunction with a rotatable disc within the meter's structure. One way of performing this tampering procedure is to form a multi-turn coil of heavy gage wire with the ends of the wire extending from the coil. The coil could comprise approximately eight to ten turns of wire and the wire could be approximately number 12 awg. The coil of wire is then disposed around the meter and the ends of the conductor are connected in electrical communication with a 240 volt AC power source. This causes an extremely high current to flow through the conductor, reaching levels of several thousand amperes. The current flowing through the coil of wire causes a very strong magnetic field and, since the coil of wire is disposed around the meter, this magnetic field is imposed on the components of the meter. The affect of this magnetic field can permanently change the level of magnetization of the permanent magnets used in the meter.

When this type of tampering is used, the changed level of magnetization of the meter's permanent magnets causes the meter to incorrectly register a magnitude of energy consumption that is higher or lower than the amount of energy actually used. The tamperer then waits some number of billing periods following the tampering effort and registers a complaint with the electric utility that the meter is faulty. When the electric utility determines that, in fact, the meter is malfunctioning due to the changed magnetization of its permanent magnets, the tamperer can claim that the metering error existed for many months previous to its discovery. Of course, the tamperer then would insist on a retroactive reduction in previous electric bills which were, in fact, correct in their amounts.

This type of tampering procedure not only costs the electric utility money in lost billing income, but also severely damages the electric meter and necessitates its replacement. Furthermore, if this tampering procedure is performed carefully, it is very difficult for the electric utility to determine the actual cause of the demagnetization.

In the particular case where this type of tampering technique is applied to an electric meter that is equipped with a transceiver and a microprocessor, it is possible to provide a means for detecting this type of tampering techniques. The present invention provides a means for detecting the use of a magnetic field for the purpose of causing a deleterious change in the characteristics of an electric meter.

In electric meters that have the capability of transmitting and receiving messages on a power line communication system, the meter is sometimes also equipped with a magnetically actuated switch for the purposes of identifying a particular type of received transmission. One type of device used in association with a power line communication system is a field configuration terminal. The field configuration terminal, or FCT, is used by an operator to communicate with an electric meter for purposes of interrogating it or altering its memory. For example, if an electric meter is suspected of operating improperly, an operator can use a field configuration terminal for the purposes of examining the memory contents of the microprocessor within the meter. Also, the field configuration terminal can be used to request information, such as kilowatt hours or alarm status.

U.S. Pat. No. 4,467,314, which issued on Aug. 21, 1984, to Weikel et al. discloses a field configuration terminal which can be used as a combination field configuration and test terminal. U.S. Pat. No. 4,467,314 is hereby incorporated by reference.

In order for an electric meter to be used in conjunction with a field configuration terminal, the electric meter must be provided with the capability of receiving messages from a power line communication system. U.S. Pat. No. 4,382,248, which issued on May 3, 1983, to Pai, discloses a device for receiving communication signals carried by the phase conductors of a multi-phase power distribution network communication system. Although this particular device includes a circuit for independently receiving each of the communication signals carried by the phase conductors, other receiving circuits are known to those skilled in the art which can be coupled to a single phase of a power line distribution system. U.S. Pat. No. 4,382,248 is hereby incorporated by reference.

In order for an electric meter to be able to communicate with a field configuration terminal by transmitting messages to it, it must have the capability of inserting carrier frequency signal information onto the power line. U.S. Pat. No. 4,323,882, which issued on Apr. 6, 1982, to Gajjar, discloses an apparatus for inserting carrier frequency signal information onto distribution primary windings. This device and many other devices known to those skilled in the art can be used to transmit amplified signals onto a power line distribution system. U.S. Pat. No. 4,323,882 is hereby incorporated by reference.

U.S. Pat. No. 3,942,170, which issued on Mar. 2, 1976, to Whyte, discloses a distribution power line carrier communication system for providing distribution automation functions. U.S. Pat. No. 3,967,264, which issued on June 29, 1976, to Whyte et al., discloses a distribution network power line communication system which is divided into addressable communication zones defined by repeaters located at the distribution transformers of the distribution network. Both of these patents are related to power line communication systems that are suitable for use with electric meters and field configuration terminals. U.S. Pat. Nos. 3,942,170 and 3,967,264 are hereby incorporated by reference.

In a typical power line communication system, messages are coded and modulated prior to their transmission to a remote device. Although many types of modulation techniques are known to those skilled in the art, one particular technique has been widely used in power line communication systems. This technique uses a phase shift keyed modulation in which a carrier signal is modulated with a base band data message. The carrier signal is a square wave signal with a constant frequency such as, for example, 12.5 kilohertz. It should be understood, however, that many different carrier frequencies can be used. A message is first coded into a baseband data format and this baseband data message is then used to modulate the carrier frequency prior to amplification and injection onto the power line system.

A power line communication device, such as an electric meter, must also have the capability of demodulating incoming messages. U.S. Pat. No. 4,311,964, which issued on Jan. 19, 1982, to Boykin, discloses a coherent phase shift keyed (PSK) demodulator for power line communication systems that includes means for sequentially processing plus and minus polarity samples of plural carrier segments occurring within each carrier data symbol. U.S. Pat. No. 4,379,284, which issued on Apr. 5, 1983, to Boykin, discloses an improved coherent phase shift keyed demodulator for power line communication systems. U.S. Pat. Nos. 4,311,964 and 4,379,284 are hereby incorporated by reference.

When an electric utility wishes to examine the operation of one of its electric meters that is connected in signal communication with a power line communication system or alter the operation of such a meter, it can utilize a portable field configuration terminal that can be transported into the field by an operator. The design and operation of a typical field configuration terminal is described in great detail in U.S. Pat. No. 4,467,314 which issued on Aug. 21, 1984, to Weikel et al. When an electric meter is intended to be used in cooperation with a field configuration terminal, it is beneficial to utilize some additional means to verify commands received from the field configuration terminal. This is usually done since the field configuration terminal has the capability of causing significant changes to the electric meter and its associated microprocessor. One known means of verifying the authorized use of a field configuration terminal is to employ a magnetically actuated switch connected in signal communication with its microprocessor within the structure of the electric meter. When an operator performs an authorized field configuration terminal operation on an electric meter, a magnetic is first placed at a location proximate the magnetically actuated switch and then the field configuration terminal is used to send commands to the electric meter's microprocessor. Normally, if the magnetically actuated switch is not properly actuated by a magnet in this manner, the commands from the field configuration terminal are ignored to avoid drastic changes to the microprocessor's data that could be caused by an errant command intended for another purpose but incorrectly interpreted as a field configuration terminal command. The magnetically actuated switch also provides a means for preventing one load management terminal from responding to a field configuration terminal's message that is intended for another load management terminal. Since the messages, between field configuration terminals and load management terminals, are injected onto the power line system, other nearby load management terminals will receive and demodulate the messages. Although other means are provided for load management terminals to verify the intended recipient of each message, the magnetically actuated switch provides additional security for this purpose.

In situations where the electric meter is provided with a magnetically operated switch, such as a read switch, a tamper detection scheme can be employed that can sense, record and report the existence of a magnetic field proximate the electric meter. Of course, when a field configuration terminal is used in conjunction with an electric meter, the magnetic field is intentionally applied by the use of a permanent magnetic and this presence of a magnetic field is authorized and legitimate. However, if a coil of wire is used to create a strong magnetic field proximate the electric meter for the purpose of tampering with its operation, the magnetically operated switch can be utilized to detect this tampering procedure. The ability to detect this type of tampering effort would be significantly beneficial to an electric utility.

The present invention provides a means for detecting the presence of a magnetic field proximate an electric meter. Furthermore, it provides a means for recording this occurrence and reporting it to either a remote station on the power line communication system or an operator using a field configuration terminal.

An electric meter made in accordance with the present invention comprises a magnetically sensitive switch and a means for sensing the state of the switch. The sensing means can be microprocessor connected in signal communication with the magnetically sensitive switch. The present invention also incorporates a means for recording the occurrence of the activated status of the switch, which can be accomplished by the use of the microprocessor, and a means for determining the legitimacy of the activated status of the switch. For example, if the present invention records the occurrence of a magnetically sensitive switch activation, but does not experience any legitimate field configuration terminal commands, this combination of indicators, or flags, is indicative of the fact that a tampering procedure utilizing a magnetic field has occurred.

The present invention also incorporates a means for communicating these status flags to remote devices. The status of the occurrence of a magnetically operated switch activation is stored in the non-volatile memory of a microprocessor system and reported, as one or more bits in a status word, during subsequent transmissions to the central station. In a preferred embodiment of the present invention, the magnetically sensitive switch is a reed switch.

In an electric meter made in accordance with the present invention, a program within its microprocessor is caused to be executed many time a second. For example, if a 60 hertz pulse is used as the activation mechanism, the program within the microprocessor would execute 60 times each second. Upon each execution of the program, the status of the magnetically activated switch is interrogated and the result is stored if an activation is sensed. Also, if a legitimate command from a field configuration terminal is received, this occurrence is also recorded in the memory of the microprocessor. Therefore, these two indicator flags can be used to determine whether or not a magnetic field was experienced by the electric meter or a field configuration terminal command was received. If the magnetic field occurred without the concurrent use of a field configuration terminal, a tampering effort is indicated.

The present invention also incorporates means for transmitting data messages to remote devices and for receiving data messages therefrom. Therefore, the present invention provides an electric meter with the capability of indicating, to a remote central station, the occurrence of a magnetic tampering effort.

BRIEF DESCRIPTION OF THE DRAWING

The present invention will be more fully understood from a reading of the description of the preferred embodiment in conjunction with the drawing, in which.

DESCRIPTION OF THE PREFERRED EMBODIMENT

Figure 1:
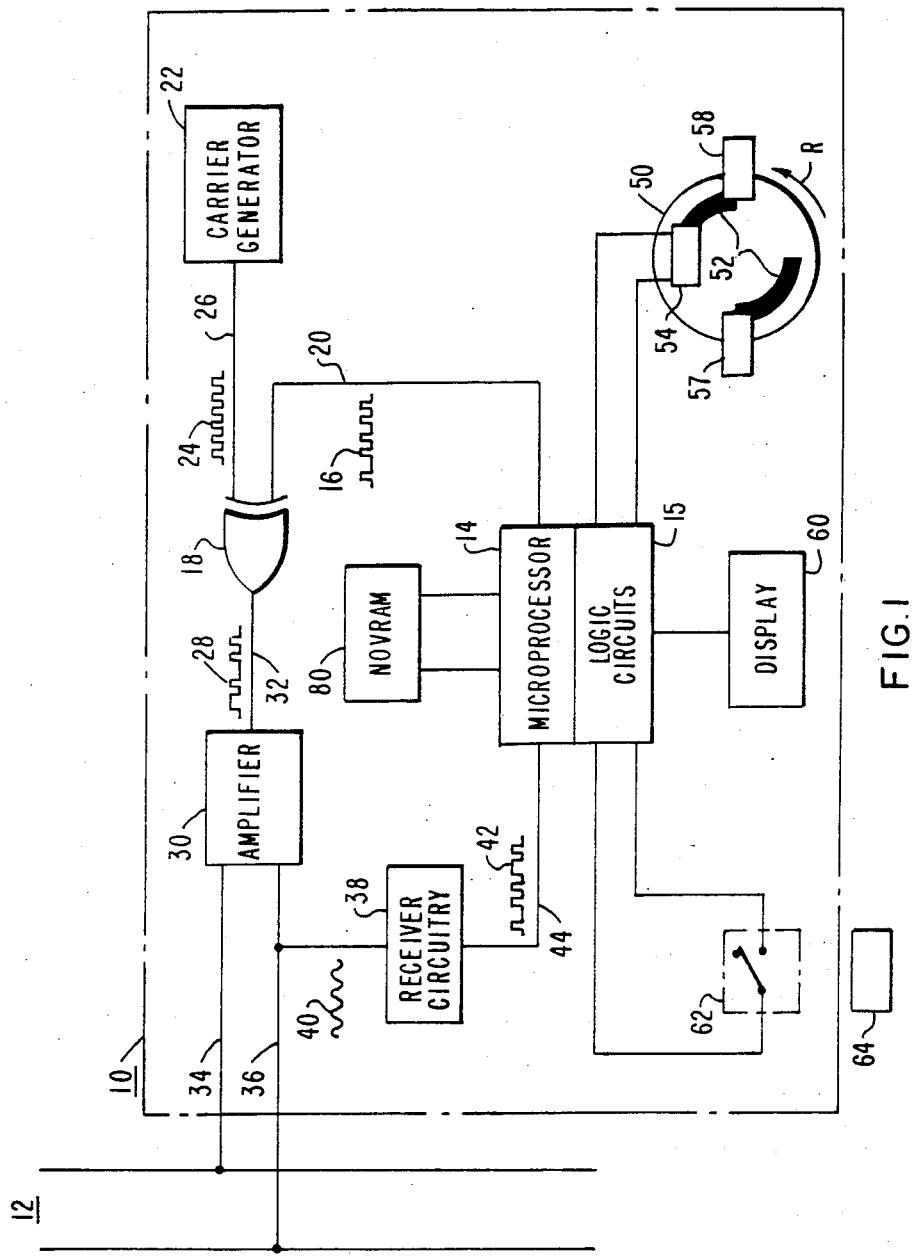
FIG. 1 illustrates an electric meter made in accordance with the present invention.

FIG. 1 illustrates an electric meter 10 made in accordance with the present invention. It is attached in signal communication with a power line system 12 and provides the capability of measuring electrical energy consumption, transmitting messages to remote devices that are connected in signal communication with the power line system 12 and receiving messages from those remote devices. Furthermore, when a field configuration terminal, or FCT, is used in association with the electric meter 10, the electric meter 10 has the capability of transmitting and receiving messages to and from the field configuration terminal since the normal operation of a field configuration terminal utilizes the power line system 12 as a communication medium.

The present invention incorporates a microprocessor 14, with logic circuits 15, that is capable of formulating messages to be transmitted to remote devices. In a preferred embodiment of the present invention, the microprocessor 14 is type MC6801 which is manufactured by the Motorola Corporation. It is operated in the expanded non-multiplexed address mode which allows 256x8 non-volatile memory (NOVRAM 80 of FIG 1) to be added externally.

The microprocessor 14 sends a baseband data message 16 to a modulator 18 on line 20. The baseband data message 16 is a signal containing a plurality of binary digits that represent a message to be transmitted. A carrier generator 22 provides a constant stream of square wave pulses 24 that are used as a carrier for the transmission of the baseband data message 16. Although many carrier frequencies can be used within the scope of the present invention, a typical frequency value is 12.5 kilohertz. The carrier signal 24 and the baseband data message 16 are connected, as inputs, to a modulator 18 that comprises an exclusive-OR gate. One of its inputs is connected to the carrier generator 22, by line 26, and its other input is connected to a microprocessor 14 by line 20. The resulting signal 28 is a phase shift keyed (PSK) modulated signal that is sent by the modulator 18 to an amplifier 30, on line 32. The amplifier is connected to the power line system 12 by lines 34 and 36.

The transmission of binary message from the electric meter 10 utilizes the microprocessor 14 and logic circuits 15, carrier generator 22, modulator 18 and amplifier 30 as discussed above. However, it should be understood that other transmitters can be used. Many types of transmitters are known to those skilled in the art. For example, U.S. Pat. No. 3,967,264, which issued on June 29, 1976, to Whyte et al., discloses a distribution network power line communication system that employs transmitters capable of sending signals on power lines. Also, U.S. Pat. No. 4,323,882, which issued on Apr. 6, 1982, to Gajjar, discloses an apparatus that is capable of inserting carrier frequency signal information onto distribution transformer primary windings.

To receive messages from remote devices that are operatively connected to the power line system 12, the present invention utilizes receiver circuitry 38 that is connected in signal communication with the power line system 12 shown by line 36 in FIG. 1. The receiver circuitry, in a preferred embodiment of the present invention, utilizes a high pass filter to remove the basic 60 hertz frequency of the power line system 12 from the received signal 40, which is basically sinusoidal. After these lower frequencies are removed from the incoming signal, the resulting signal is hard limited. This results in an essentially square wave signal 42 which is sent to the microprocessor 14 on line 44. The microporssor utilizes a demodulator to demodulate the message signal from extraneous noise. U.S. Pat. No. 4,311,964, which issued on Jan. 19, 1982 to Boykin, and U.S. Pat. No. 4,379,284 which issued on Apr. 5, 1983, to Boykin, describe coherent phase shift keyed (CPSK) demodulators for use with power line communication systems. An example of a power line communication system receiver is described in U.S. Pat. No. 4,382,248, which issued on May 3, 1983, to Pai.

The primary function of the electric meter 10 illustrated in FIG. 1 is the measurement of electrical energy consumption. Many methods are known to those skilled in the art for measuring electrical energy consumption. One particular method incorporates a rotatable disc 50 that contains marks 52 on its surface that facilitate the detection of rotation of the disc 50. As the disc 50 rotates in the direction indicated by arrow R, for example, the marks 52 pass under a sensing head 54. The sensing head can comprise a photosensitive diode and a light emitting diode that transmit and detect a light beam reflected by the surface of the disc 50. When the marks 52 pass under the sensing head 54, this passage can thus be detected. However, it should be understood that the present invention is not limited to use with any particular type of measurement technique. For example, optical encoding registers can be incorporated in the present invention and connected in signal communication with its microprocessor. This type of system is described in U.S. Pat. No. 4,342,908, which issued on Aug. 3, 1982, to Henningsen et al. Also, many different types of pulse initiators can be used to generate signal pulses representative of the consumption of electrical energy, such as indicated by the rotation of the disc 50. U.S. Pat. No. 4,034,292, which issued on July 5, 1977, to McClelland, discloses a direction sensitive opto-electronic pulse initiator for electrical meters and U.S. Pat. No. 3,943,498, which issued on Mar. 9, 1976, to McClelland et at., discloses a direct input photoelectric pulse initiator for meter telemetry and recording systems.

In electric meters, permanent magnets are utilized to provide the required accuracy and correlation between actual electrical energy consumption and the rotation of the disc 50. Examples of the use of permanent magnets in electric meters are described in U.S. Pat. No. 3,683,276, which issued on Aug. 8, 1972, to Ramsey, U.S. Pat. No. 3,810,683, which issued on May 14, 1974 to Zisa et al., and U.S. Pat. No. 4,424,485, which issued on Jan. 3, 1984 to Zisa. These types of permanent magnet structures are schematically illustrated by reference numerals 57 and 58 in FIG. 1. As described above, any significant change in the magnetization of these magnets, 57 and 58, will adversely affect the operation of the electric meter 10.

In some applications, electric meters are provided with a display 60. The display is used to transmit information, visually, to an observer. Although the display 60 can utilize liquid crystal technology, many other types of displays are known to those skilled in the art. U.S. Pat. No. 4,462,026, which issued on July 24, 1984 to Munday, discloses an electronic display apparatus using time multiplexed data and control signals and is hereby incorporated by reference.

As described above, some electrical meters are provided with a magnetically actuated switch 62 that is connected in signal communication with the microprocessor 14 and logic circuits 15 of the electric meter 10. This type of magnetically activated switch can be a reed switch. Although many different types of magnetically actuated switches can be used within the scope of the preferred embodiment of the present invention, reed switches of type MHRR-2 made by the Hamlin Corporation, type 326-12-2 made by the Wabash Corporation, or type 519287 made by the Clare Corporation have been determined to be applicable for use with the present invention.

When a magnet 64 is placed proximate the magnetically sensitive switch 62, the switch is actuated and a signal is received by the microprocessor 14. The interaction between the magnet 64 and the switch 62 provides a means for verifying the proper use of a field configuration terminal in conjunction with the electrical meter. For example, when an operator is sent to a residence for the purpose of examining the operation of an electric meter, a hand-carried magnet 64 is disposed proximate the portion of the electric meter 10 that contains the switch 62. Then the field configuration terminal, or FCT, is used to transmit commands and interrogate the microporcessor 14 of the electric meter 10. When the microporcessor receives commands that are identified as having been transmitted by a field configuration terminal, it can then examine the status of the switch 62 to verify that the commands are legitimate. If no signal is received from the switch 62, the microprocesor will determine that the commands that were apparently received from a field configuration terminal are, in fact, not legitimate field configuration terminal commands because the magnet 64 was not used by the operator as a verification technique.

The existence of a magnetically sensitive switch 62 within an electric meter 10 is advantageously used for another purposes by the present invention. If any attempt is made to induce a strong magnetic field around the electric meter 10, for the purpose of tampering with its operation, the switch 62 will be closed due to the existence of the magnetic field and a signal will be made available for receipt by the microprocessor 14 and logic circuits 15.

Figure 2:
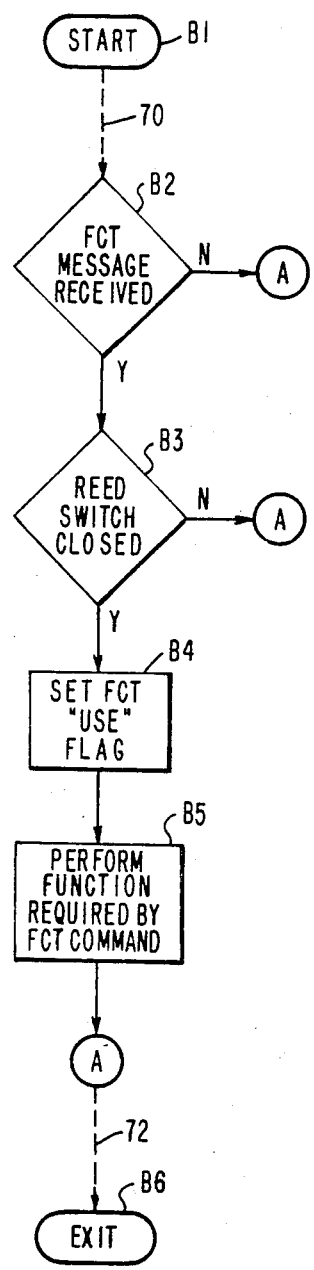
FIG. 2 illustrates a flow chart of a program segment within the microprocessor of an electric meter configured for use with a power line communication system.

In order to understand how the magnetically sensitive switch 62 is used in the normal operation of an electric meter 10, the normal operation of the electric meter 10 will be discussed as it relates to the program within its microprocessor and a typical field configuration terminal application. FIG. 2 illustrates a portion of the program that resides, in the microprocessor of an electric meter. At block B1, the program is started. In a typical application, the program within the microprocessor is initiated at a constant frequency. For example, if a 60 hertz frequency pulse source is available, it can be used to cause an interrupt which begins the operation of the program sixty times each second. In FIG. 2, dashed line 70 indicates that the program in the microprocessor would normally be used to perform many tasks upon initiation that are not directly related to the present invention or the use of field configuration terminals and magnetically sensitive switches. For purposes of clarity, these portions of the program are not illustrated in FIG. 2 and, instead, are represented by the dashed line 70 that indicates the portion of the program that would be executed prior to block B2.

The program determines whether or not a field configuration terminal message has been received, as indicated by block B2. When a message is received from a field configuration terminal, it is readily identifiable by its address which defines it clearly as a field configuration terminal and not a central communication station or another remote device. If the received message is indicative that it was transmitted by a field configuration terminal, the answer to the question of block B2 is affirmative. If a field configuration terminal message is not received, the program proceeds to point A and continues with other functions that are not related to field configuration terminals, magnetically sensitive switches or other elements of the present invention. This fact is represented by dashed line 72.

If, however, a field configuration terminal (FCT) message has been received, the program then determines whether or not the magnetically sensitive switch 62, such as a reed switch, is closed. This interrogation is illustrated in block B3. If the reed switch is not closed, the FCT message is ignored as indicated by the passage of the program to point A. This sequence of operation would occur if a message was received that apparently was sent by a field configuration terminal, but the magnetically sensitive switch 62 was not closed. In these circumstances, the microprocessor assumes that the message was not actually sent to it by a field configuration terminal and can only be explained as an erroneous transmission with an incorrect address that appeared to be indicative of a field configuration terminal transmission.

However, if the read switch was closed during the receipt of a message from a field configuration terminal, the program proceeds to block B4 and sets a flag that represents the receipt of an FCT message. This FCT "use" flag indicates, for future reference, that an operator used a field configuration terminal to transmit and receive message between it and the electric meter 10. Next, as indicated by block B5 in FIG. 2, the microprocessor performs the functions that are required by the FCT command. These functions can vary significantly, depending on the purpose of the use of the field configuration terminal by the operator in the field. For example, the FCT command can be for a data display of information relating to either the electric energy consumption of the consumer or other data variables stored within the memory of the microprocessor or its associated non-volatile random access memory NOVRAM 80. The functions to be performed as indicated by block B5 can also comprise alterations to the electric meter 10 itself. For example, one possible function could be the actual change of the address of the electric meter 10. After these functions are performed, the program illustrated in FIG. 2 passes to point A and then performs other operations that are not related to the present invention before exiting, as indicated by block B6, to await a subsequent initiation at which time it would begin again at block B1.

Figure 3:
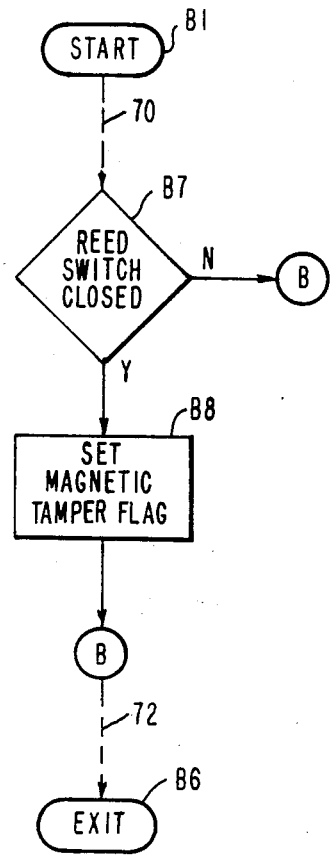
FIG. 3 depicts a program segment incorporated within the microprocessor of an electric meter made in accordance with the present invention.

FIG. 3 illustrates the portion of the program within the microprocessor that relates to the implementation of the present invention. When the program is initiated, as indicated by block B1, and after preliminary operations are performed, as indicated by dashed line 70, the microprocessor checks to see if the reed switch is activated. This operation is done at block B7 and comprises the examination of the status of the signal received from the switch 62. This switch signal interrogation is completely independent from any field configuration terminal operations. The reed switch is examined each time the program, illustrated in FIG. 3, is executed. As discussed above, this program is typically executed sixty times each second. If the reed switch is not activated, the program proceeds to point B and continues with its other operations. However, if the reed switch is activated, the program sets a magnetic tamper flag, as indicated by block B8.

In this embodiment of the present invention, the tamper flag is set at any time that the reed switch is sensed as being activated. This could include a legitimate field configuration terminal operation which, as described above, utilizes the intentional activation of the switch 62 by the magnet 64. Therefore, it should clearly be understood that the magnetic tamper flag will be set by either of two conditions. First, during normal field configuration terminal operations, the flag will be set because the magnet 64 was intentionally disposed proximate the switch 62. Furthermore, the presence of a magnetic field in the region of the electric meter 10 will cause the switch 62 to be activated and will result in the setting of the magnetic tamper flag. This letter condition would represent a likely attempt to tamper with the electric meter by the use of a strong magnetic field.

Upon the transmission of the electric meter's status flag to a central station receiver, the central station can observe the presence of a status flag indicating that the magnetic tamper flag has been set. The central station then can interrogate the electric meter 10 to determine whether or not a field configuration terminal has been used in association with the meter. If not, the electric utility has information which it can use to determine that a tampering attempt has been made to adversely affect the operation of an electric meter by using a strong magnetic field to demagnetize its permanent magnets.

It should be understood that, in the normal application of the present invention, a first value is set in response to the reed switch being closed. In FIG. 3, this first value is referred to as a magnetic tamper flag. Furthermore, a second value is usually maintained for purposes of representing a plurality of status conditions. For example, if the second value is a 16 bit computer memory word, the status of 16 conditions can be simultaneously maintained and transmitted within the status word to the central station.

The present invention has been described with considerable detail and specificity. However, it should be understood that the present invention should not be considered to be so limited and alternative embodiments of the present invention are within its scope.

What is claimed is:

1. An electric meter, for detecting magnetic tampering comprising:
   a magnetically sensitive switch;
   first means for sensing the status of said switch, said sensing means being connected in electrical communication with said switch;
   first means for storing a first signal representative of the occurrence of an activated status of said switch;
   second means for sensing the occurrence of a predefined activity, said predefined activity occurring externally of said electric meter;
   second means for storing a second signal representative of said occurrence of said predefined activity;
   said first sensing means being connected in signal communication with said second sensing means; and
   means for communicating said first and second signals to a remote device, said communicating means being associated in signal communications with said first and second storing means.

2. The meter of claim 1, wherein:
   said switch is a reed switch.

3. The meter of claim 1, further comprising:
   a microprocessor connected in signal communication with said switch, said microprocessor comprising said first and second sensing means.

4. A electric meter for detecting magnetic tampering comprising:
   means for transmitting a first data message to remote devices, said remote devices being in power line signal communication with said communications device;
   means for receiving a second data message from said remote devices, said receiving means being in power line signal communication with said remote devices;
   means for sensing the existence of an externally applied magnetic field proximate said communications device;
   first means for storing a first signal representative of a sensed existence of said externally applied magnetic field, said first storing means being connected in signal communication with said sensing means;
   means for determining if said second data message was transmitted by a predefined type of said remote devices;
   second means for storing a second signal representative of the receipt of said second data message from said predefined type of said remote devices; and
   means for including said first and second signals in said first data message, said including means being associated in signal communications with said first and second storing means.

5. The device of claim 4, wherein:
   said sensing means is a reed switch.

6. An electric meter, for detecting magnetic tampering comprising:

a magnetically actuated reed switch;

first means for sensing an actuation of said switch, said first sensing means being connected to said switch;

first means for storing a first value representative of said actuation, said first storing means being connected in signal communications with said first sensing means;

second meand for sensing the occurrence of a predefined activity, said predefined activity occurring externally of said electric meter;

second means for storing a second value representative of said occurrence of said predefined activity; and means for transmitting said first and second values to a remote device.

7. The meter of claim 6, wherein:

said first and second sensing means and said first and second storing means comprise a microprocessor.

8. The meter of claim 7, wherein:

said meter is connected in signal communication with a power line communication system.

* * * * *